United States Patent
Xue et al.

(10) Patent No.: US 11,785,832 B2
(45) Date of Patent: Oct. 10, 2023

(54) DISPLAY DEVICE AND METHOD FOR MANUFACTURING THE SAME

(71) Applicant: BOE TECHNOLOGY GROUP CO., LTD., Beijing (CN)

(72) Inventors: Jinxiang Xue, Beijing (CN); Zhongyuan Sun, Beijing (CN); Kai Sui, Beijing (CN); Xiang Zhou, Beijing (CN); Jingkai Ni, Beijing (CN); Wenqi Liu, Beijing (CN); Xiaofen Wang, Beijing (CN); Chao Dong, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 155 days.

(21) Appl. No.: 17/353,190

(22) Filed: Jun. 21, 2021

(65) Prior Publication Data

US 2021/0313528 A1 Oct. 7, 2021

Related U.S. Application Data

(63) Continuation of application No. 16/616,174, filed as application No. PCT/CN2019/088723 on May 28, 2019, now Pat. No. 11,251,383.

(30) Foreign Application Priority Data

Jul. 24, 2018 (CN) .......................... 201810817798.7

(51) Int. Cl.
*H01L 51/00* (2006.01)
*H10K 77/10* (2023.01)
(Continued)

(52) U.S. Cl.
CPC ........... *H10K 77/111* (2023.02); *G09G 3/035* (2020.08); *H10K 59/131* (2023.02); *H10K 71/00* (2023.02);
(Continued)

(58) Field of Classification Search
CPC .................................................. H01L 51/0097
See application file for complete search history.

(56) References Cited

U.S. PATENT DOCUMENTS

| 5,469,020 A | 11/1995 | Herrick |
| 9,395,863 B2 | 7/2016 | Nakayama et al. |
| (Continued) | | |

FOREIGN PATENT DOCUMENTS

| CN | 104679322 A | 6/2015 |
| CN | 105492991 A | 4/2016 |
| (Continued) | | |

OTHER PUBLICATIONS

U.S. Appl. No. 16/616,174 Non-Final Office Action dated Apr. 2, 2021.

(Continued)

*Primary Examiner* — Yu-Hsi D Sun
(74) *Attorney, Agent, or Firm* — The Webb Law Firm (57) ABSTRACT

The present disclosure relates to a display device and a method of manufacturing the same. The display device includes: a plurality of display units, each display unit including one or more pixels; and a plurality of elastically stretchable stretching units respectively connected among the plurality of display units and forming elastic connection points with the display units, the stretching units and the plurality of display units forming a net-shaped distribution structure, wherein in a state that the display device is not under tension, a connection lines between the elastic connection points at both ends of the stretching unit are not parallel to a normal of the display units connected with at least one end of the stretching unit at the elastic connection points.

18 Claims, 8 Drawing Sheets

(51) Int. Cl.
  *G09G 3/00* (2006.01)
  *H10K 59/131* (2023.01)
  *H10K 71/00* (2023.01)
  *G09F 9/30* (2006.01)
  *G09F 9/33* (2006.01)
  *H10K 59/12* (2023.01)
  *H10K 102/00* (2023.01)

(52) U.S. Cl.
  CPC .............. *G09F 9/301* (2013.01); *G09F 9/33* (2013.01); *H10K 59/1201* (2023.02); *H10K 2102/311* (2023.02)

(56) References Cited

U.S. PATENT DOCUMENTS

| | | | |
|---|---|---|---|
| 9,799,708 | B2 | 10/2017 | Hong et al. |
| 9,869,807 | B2 | 1/2018 | Kim et al. |
| 10,649,496 | B2 | 5/2020 | Choi et al. |
| 2013/0021566 | A1 | 1/2013 | Akitomo et al. |
| 2015/0153873 | A1 | 6/2015 | Lee et al. |
| 2016/0104850 | A1 | 4/2016 | Joo et al. |
| 2016/0240802 | A1 | 8/2016 | Lee |
| 2017/0003440 | A1 | 1/2017 | Kim et al. |
| 2019/0088894 | A1* | 3/2019 | Park .................. H01L 27/3218 |

FOREIGN PATENT DOCUMENTS

| | | |
|---|---|---|
| CN | 105514115 A | 4/2016 |
| CN | 105977276 A | 9/2016 |
| CN | 106971671 A | 7/2017 |
| CN | 107221550 A | 9/2017 |
| CN | 206524333 U | 9/2017 |
| CN | 107393421 A | 11/2017 |
| CN | 206685390 U | 11/2017 |
| CN | 107710885 A | 2/2018 |
| CN | 107731866 A | 2/2018 |
| CN | 108122884 A | 6/2018 |
| CN | 108227281 B | 6/2018 |
| CN | 108269501 A | 7/2018 |
| EP | 2824654 B1 | 8/2016 |
| EP | 3223327 A1 | 9/2017 |
| JP | 5429775 B2 | 2/2014 |
| JP | 6236561 B1 | 11/2017 |
| KR | 1020130002344 A | 1/2013 |
| TW | 201443737 A | 11/2014 |

OTHER PUBLICATIONS

U.S. Appl. No. 16/616,174 Final Office Action dated Jul. 23, 2021.
U.S. Appl. No. 16/616,174 Notice of Allowance and Fee(s) Due dated Oct. 13, 2021.

* cited by examiner

DISPLAY DEVICE AND METHOD FOR MANUFACTURING THE SAME

CROSS-REFERENCE TO RELATED APPLICATIONS

This application is a continuation of U.S. patent application Ser. No. 16/616,174, filed on Nov. 22, 2019, which is the United States national phase of International Application No. PCT/CN2019/088723 filed May 28, 2019 and claims priority to CN Application No. 201810817798.7, filed on Jul. 24, 2018, the disclosures of which are hereby incorporated by reference in entirety.

TECHNICAL FIELD

The present disclosure relates to a display device and a method for manufacturing the same.

BACKGROUND OF THE INVENTION

In some electronic devices, the display device is capable of outputting visual information to a user. Some display devices are also capable of receiving input instructions from a user. With development of display technologies, flexible display devices that are bendable/foldable have appeared and been applied to various electronic devices.

SUMMARY OF THE INVENTION

In one aspect of the present disclosure, a display device is provided, including:
a plurality of display units, each display unit including one or more pixels; and
a plurality of elastically stretchable stretching units respectively connected among the plurality of display units and forming elastic connection points with the display units, the stretching units and the plurality of display units forming a net-shaped distribution structure,
wherein, in a state that the display device is not under tension, a connection line between the elastic connection points at both ends of the stretching unit is not parallel to a normal of the display unit connected with at least one end of the stretching unit at the elastic connection points.

In some embodiments, the plurality of display units include:
a plurality of first type display units; and
a plurality of second type display units respectively connected with the plurality of first type display units through the stretching units, each elastic connection point on the second type display unit including at least one group of elastic connection points which are axisymmetric relative to a center line of the second type display unit;
wherein, when the display device is not under tension, along a same rotation direction of the first type display unit, a connection line between elastic connection points at both ends of each stretching unit connected with the first type display unit forms an acute angle with a normal of the first type display unit at the elastic connection points corresponding to the connection line.

In some embodiments, the first type display units are alternately connected with the second type display units.

In some embodiments, the first type display unit includes a pixel region having an area smaller than that of a pixel region included in the second type display unit.

In some embodiments, the first type display unit has a circular shape, and the second type display unit has a square or regular hexagonal shape.

In some embodiments, the plurality of first type display units include:
a first display unit configured such that when the display device is not under tension, along a first rotation direction of the first display unit, a connection line between elastic connection points at both ends of each stretching unit connected with the first display unit forms an acute angle with a normal of the first display unit at the elastic connection points; and
a second display unit configured such that when the display device is not under tension, along a second rotation direction of the second display unit, a connection line between elastic connection points at both ends of each stretching unit connected with the second display unit forms an acute angle with a normal of the second display unit at the elastic connection points,
wherein the second rotation direction is opposite to the first rotation direction.

In some embodiments, the first display units and the second display units are provided alternately in at least one preset direction in the net-shaped distribution structure.

In some embodiments, the at least one preset direction includes a first direction and a second direction that are orthogonal to each other.

In some embodiments, the stretching unit has a straight strip shape.

In some embodiments, the stretching unit is formed integrally with substrate of the plurality of display units.

In some embodiments, the net-shaped distribution structure includes a plurality of polygonal meshes, and a number of sides of at least part of plurality of the polygonal meshes is greater than or equal to four.

In some embodiments, the net-shaped distribution structure includes a plurality of meshes, and at least part of the plurality of meshes include hollow structures.

In some embodiments, at least part of the elastic connection points formed by the stretching units and the display units are provided with a corrugated structure.

In some embodiments, further including: a signal line, arranged in the stretching unit, for a signal connection of adjacent display units connected with the stretching unit.

In some embodiments, the display unit includes an organic light emitting diode or a quantum dot light emitting diode.

In one aspect of the present disclosure, a method for manufacturing a display device is provided, including:
providing a substrate;
forming, on the substrate, a plurality of display units and a plurality of elastically stretchable stretching units respectively connected among the plurality of display units in a net-shaped distribution structure,
wherein the stretching units form elastic connection points with the display units, and in a state that the display device is not under tension, a connection line between the elastic connection points corresponding to both ends of the stretching unit is not parallel to a normal of the display unit connected with at least one end of the stretching unit at the elastic connection points.

In some embodiments, the operation of forming the display units and the stretching unit includes:
forming, on the substrate, thin film transistors of the respective display units and signal lines connected among the thin film transistors of the display units according to the net-shaped distribution structure;

etching the substrate on which the thin film transistors is formed according to the net-shaped distribution structure in order to form respective meshes in the net-shaped distribution structure; and forming a light emitting layer on the thin film transistor of each display unit.

BRIEF DESCRIPTION OF THE DRAWINGS

The drawings, which constitute a part of this specification, illustrate embodiments of the present disclosure, and together with the description, serve to explain the principles of the present disclosure.

The present disclosure may be more clearly understood from the following detailed description, taken with reference to the drawings, in which.

It should be understood that the dimensions of the various parts shown in the figures are not drawn according to the actual proportional relationship. Further, the same or similar reference signs denote the same or similar components.

DESCRIPTION OF THE INVENTION

Various exemplary embodiments of the present disclosure will now be described in detail with reference to the drawings. The description of the exemplary embodiments is merely illustrative and is in no way intended to limit the disclosure, its application, or usage. The present disclosure may be embodied in many different forms and is not limited to the embodiments described herein. These embodiments are provided so that this disclosure will be thorough and complete, and will fully convey the scope of the disclosure to those skilled in the art. It should be noted that: the relative arrangement of parts and steps set forth in these embodiments should be construed as exemplary only and not as limiting unless otherwise specifically noted.

The use of "first", "second", and similar terms in this disclosure is not intended to indicate any order, quantity, or importance, but rather, they are used to distinguish one element from another. The word "comprising" or "including", or the like, means that the element preceding the word covers the element listed after the word, without exclusion of the possibility that other elements are also covered. Words like "upper," "lower," "left," "right," and the like are used merely to indicate relative positional relationships, and when the absolute position of the object being described is changed, the relative positional relationships may also be changed accordingly.

In the present disclosure, when a specific device is described as being located between a first device and a second device, there may or may not be intervening devices between the specific device and the first device or the second device. When a specific device is described as being coupled to other devices, that specific device may be directly coupled to the other devices without intervening devices or may not be directly coupled to the other devices with intervening devices.

All terms (including technical or scientific terms) used herein have the same meaning as understood by ordinary skilled in the art to which this disclosure belongs unless specifically defined otherwise. It will be further understood that terms, such as those defined in common dictionaries, should be interpreted as having a meaning that is consistent with their meaning in the context of the relevant art and will not be interpreted in an idealized or overly formal sense unless expressly so defined herein.

Techniques, methods, and apparatuses known to the ordinary skilled in the relevant art may not be discussed in detail but are intended to be part of the specification where appropriate.

The inventors have found by research that, in some related arts, although a substrate or a circuit layer of a display device has bendability, the amount of stretch is limited. If forcedly stretched, the organic layer, the inorganic layer, and the substrate or the circuit used for encapsulation may be broken or irreversibly deformed.

In view of this, the embodiments of the present disclosure provide a display device with improved stretching performance and a method for manufacturing the same.

Figure 1:
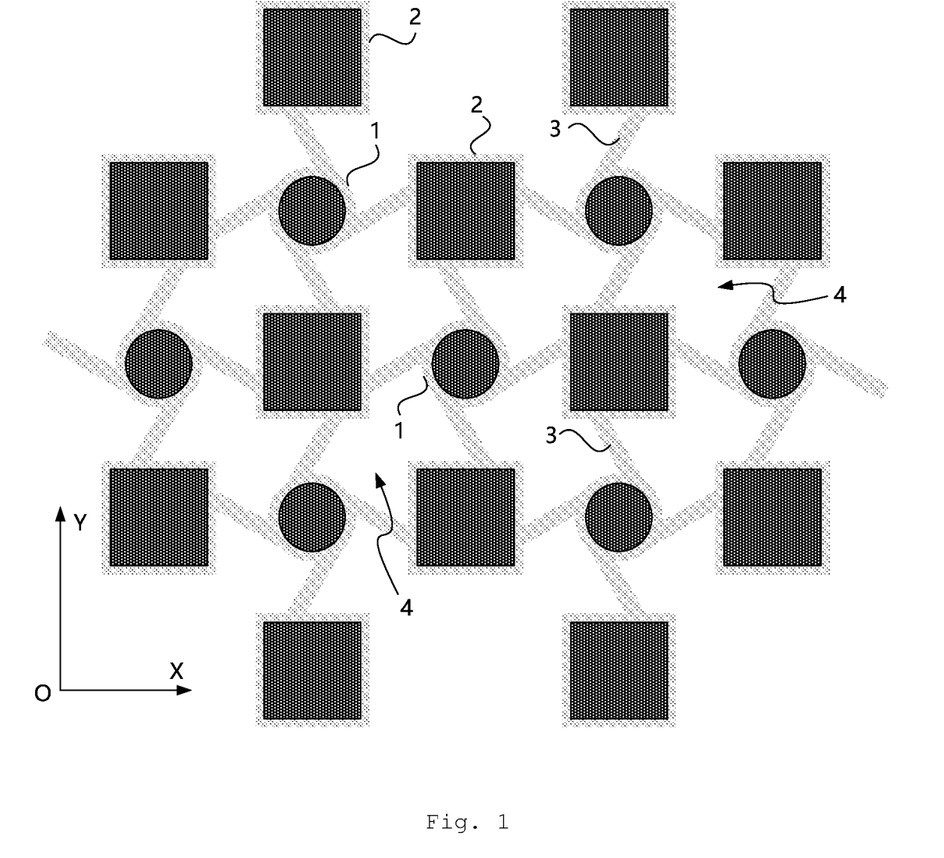
FIG. 1 is a schematic structural diagram of one embodiment of a display device according to the present disclosure.

FIG. 1 is a schematic structural diagram of one embodiment of a display device according to the present disclosure.

Referring to FIG. 1, in some embodiments, a display device includes a plurality of display units 1, 2 and a plurality of elastically stretchable stretching units 3. Each display unit has one or more pixels for performing a display function. In some embodiments, the display unit can include an Organic Light Emitting Diode (OLED). In other embodiments, the display unit can include other light emitting layers such as an inorganic Light Emitting Diode (LED) or a Quantum dot Light Emitting Diode (QLED).

The plurality of elastically stretchable stretching units 3 are respectively elastically connected among the plurality of display units to form a net-shaped distribution structure with the plurality of display units. Elastic stretchability means that when opposite traction forces are applied to both ends of the stretching unit 3, the stretching unit 3 can be extended in the lengthwise direction and can be restored to the original length after the traction forces are removed. In other words, each display unit corresponds to a node in the net-shaped distribution structure, and the stretching unit 3 corresponds to a connection line between the nodes. In some embodiments, the net-shaped distribution structure of FIG. 1 shows a small local structure in the display device, and other parts of the display device not shown can also refer to the connection structure shown in FIG. 1. The net-shaped distribution structure can be a planar net-shaped distribution structure and can also be a net-shaped distribution structure along a curved surface or an irregular surface.

The plurality of display units and the plurality of stretching units 3 adjacent to each other in the X-axis direction and the Y-axis direction in FIG. 1 can constitute a plurality of meshes included in the net-shaped distribution structure, and in the case of a polygonal mesh having a polygonal shape, an entire polygonal mesh can be further formed. Based on the consideration of improving the stretchability, the number of sides of the polygonal mesh can be greater than or equal to four to obtain a larger deformation space. In other embodiments, the number of sides of the mesh 4 can also be three to form a more stable triangular mesh. In the display device, meshes of various shapes and sizes can be used in combination. The mesh 4 can include a hollow structure to eliminate the limitation on the movement and stretching of the stretching unit 3 by the internal structure of the mesh. In other embodiments, the mesh 4 cannot include a hollow structure therein; for example, the mesh 4 includes a thinner and more stretchable substrate structure.

In the quadrilateral mesh shown in FIG. 1, the plurality of display units can specifically include a plurality of first type display units 1 and a plurality of second type display units 2 based on the characteristics. The plurality of second type display units 2 can be connected to the plurality of first type display units 1 through the plurality of stretching units 3, respectively.

Referring to FIG. 1, first type display units 1 can be alternately connected to second type display units 2. In other words, in the embodiment of the display device shown in FIG. 1, both ends of the stretching unit 3 are respectively connected to the first type display unit 1 and second type display unit 2 adjacent to each other. In other embodiments, two adjacent display units connected to both ends of the stretching unit 3 can be both the first type display unit 1 or both the second type display unit 2, or can be connected to other display units, respectively.

Figure 2:
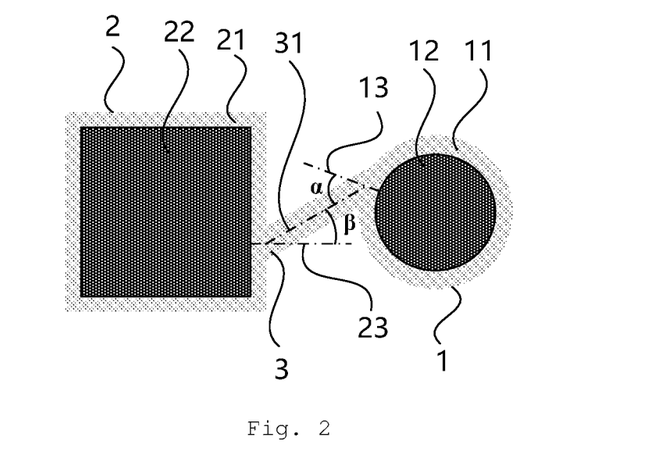
FIG. 2 is a schematic diagram of a connection structure between adjacent display units in one embodiment of a display device according to the present disclosure.

FIG. 2 is a schematic diagram of a connection structure between adjacent display units in one embodiment of a display device according to the present disclosure.

For convenience of explanation on the connection structure of the adjacent display units, the following is described in detail with reference to FIG. 2. The stretching unit 3 in FIG. 2 has a straight strip shape, and one end of the stretching unit is elastically connected to an edge 11 of the first type display unit 1, so that the stretching unit 3 can elastically swing around the elastic connection point with the first type display unit 1 as an axis. An angle $\alpha$ between a normal 13 of the first type display unit 1 at the elastic connection points and a connection line 31 which is between the elastic connection points at the both ends of the stretching unit 3 (i.e. the lengthwise direction of the stretching unit 3 in a straight strip shape) is an acute angle. Another end of the stretching unit 3 is elastically connected to an edge 21 of the second type display unit 2, so that the stretching unit 3 can elastically swing around the elastic connection point with the second type display unit 2 as an axis. The angle $\beta$ between the connection line 31 and a normal 23 of the second type display unit 2 at the elastic connection points is an acute angle.

In other embodiments, the shape of the stretching unit 3 is not limited to a straight strip shape and can be an arc shape or a zigzag shape. Accordingly, the connection line 31 between the elastic connection points corresponding to both ends of the stretching unit 3 cannot coincide with the lengthwise direction of the stretching unit 3. The connection line 31 can be not parallel to the normal of the elastic connection point at only one end of the stretching unit 3 or can be not parallel to the normals of the elastic connection points at both ends of the stretching unit 3. Therefore, the display device can be stretched longer by superposing the elastic deformation of the stretching unit itself and the elastic deformation of the elastic connection point of the stretching unit and the display unit, so that better stretching performance can obtained.

In some embodiments, the stretching unit 3 can be integrally formed with the substrate of the plurality of display units. For example, an edge of the display unit and the stretching unit 3 can be integrally formed by a substrate having elasticity to form an elastic connection structure between the display unit and the stretching unit 3. In other embodiments, the edge of the display unit and the stretching unit 3 can be connected by other means, such as bonding or connecting by means of other elastic connection structures.

Figure 3A:
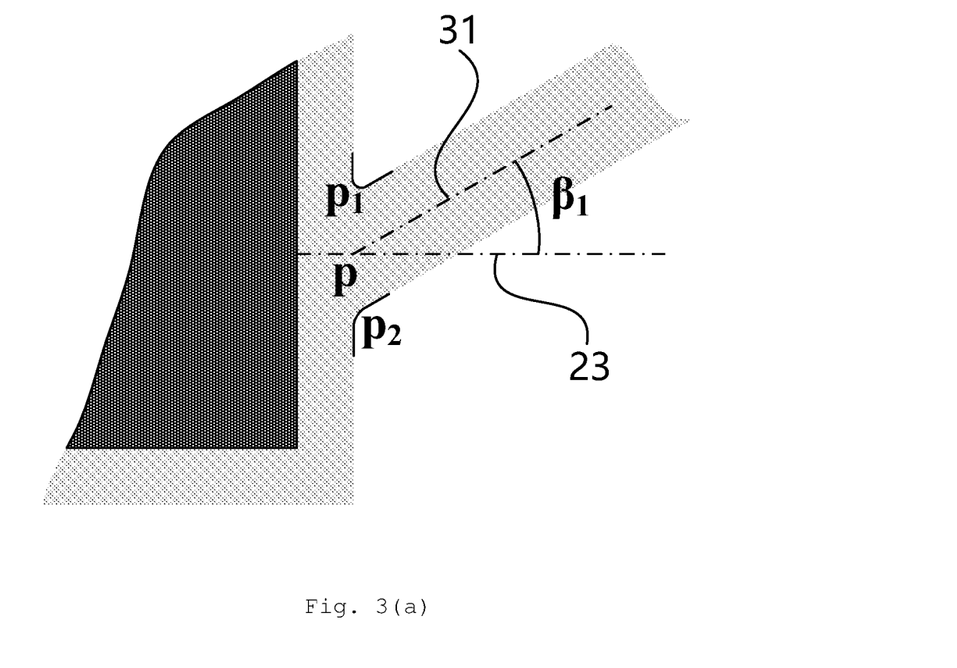
FIGS. 3(a)-3(b) are respectively enlarged partial views of the elastic deformation of the elastic connection point in the embodiment of FIG. 2.
Figure 3B:
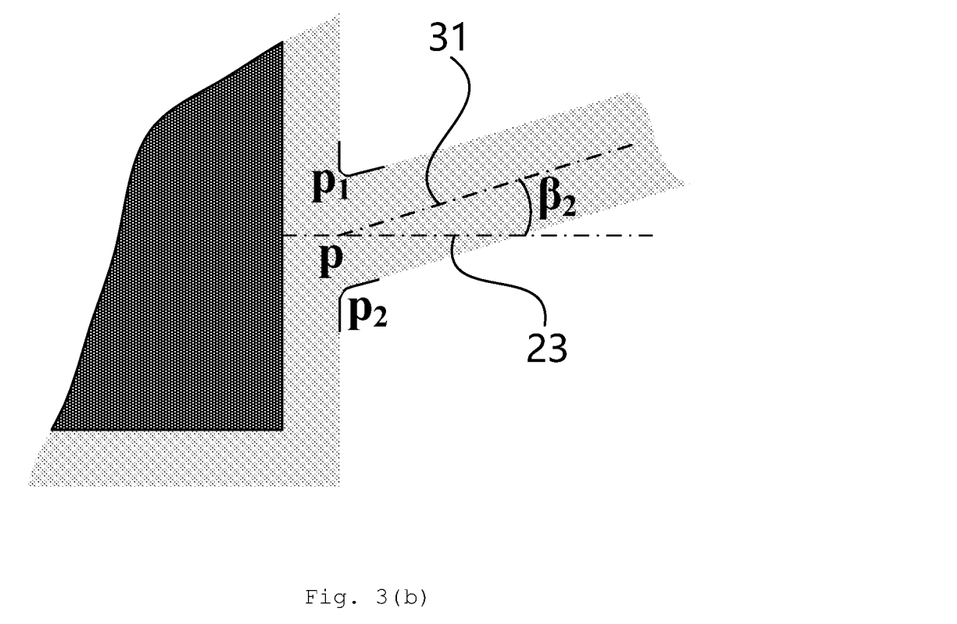

FIGS. 3(*a*)-3(*b*) are respectively enlarged partial views of the elastic deformation of the elastic connection points in the embodiment of FIG. 2, respectively.

In FIG. 3(*a*), the connection portion between the stretching unit and the display unit is defined as an elastic connection point in the present disclosure. Considering the width of the stretching unit itself, the elastic connection point actually corresponds to a range of connection of the stretching unit with the edge of the display unit, i.e., the section from p1 to p2 in FIG. 3(*a*). The center line of the stretching unit intersects with the edge of the display unit at an intersection point p. The normal 23 corresponding to the elastic connection point can be a vertical line perpendicular to a tangent plane of the display unit at the intersection point p and extending along a direction away from the display unit, and the vertical line passes through the intersection point p. For the case that the display edges corresponding to the elastic connection points are flush, the normal can also be a vertical line of the tangent plane of the display unit at p1 or p2. The locations of p1 and p2 can be chamfered or rounded to avoid excessive stress concentrations.

Referring to FIG. 3(*a*), the angle between the normal 23 and the connection line 31 is an acute angle $\beta_1$. This means that a portion of the stretching unit on the side close to the display unit is arranged obliquely with respect to the edge of the stretching unit, and a portion of the stretching unit at the position $p_1$ makes an acute angle with the edge profile of the display unit, while a portion of the stretching unit at the position $p_2$ makes an obtuse angle with the edge profile of the display unit. When the display device is under tension, the stretching unit can swing relative to the display unit under the action of the tension, and the portions corresponding to $p_1$ and $p_2$ and the portion between $p_1$ and $p_2$ will be deformed.

Referring to FIG. 3(*b*), when the connection line 31 between the both ends of the stretching unit swings to a direction parallel to or coincident with the normal 23, the position $p_1$ is deformed and unfolded, so that the included angle at this position becomes larger. And the position $p_2$ deforms and contracts, so that the included angle at that position is reduced. The angle between the connection line 31 and normal 23 decreases from $\beta_1$ to $\beta_2$. When the tension applied to the display device is released, the elastic action point will return to the state when it is not subjected to the tension under an elastic action, i.e. the connection line 31 swings away from a direction parallel to the normal 23 or coincident with the normal 23, and the position $p_1$ contracts back to its original state, so that the included angle at this position becomes smaller. And the position $p_2$ expands back to its original state, so as to increase the included angle at this position. The angle between the connection line 31 and normal 23 is restored to $\beta_1$.

FIGS. 4(a)-4(d) are schematic diagrams of adjacent display units having progressively larger distances when being under tension in one embodiment of a display device according to the present disclosure.

Figure 4A:
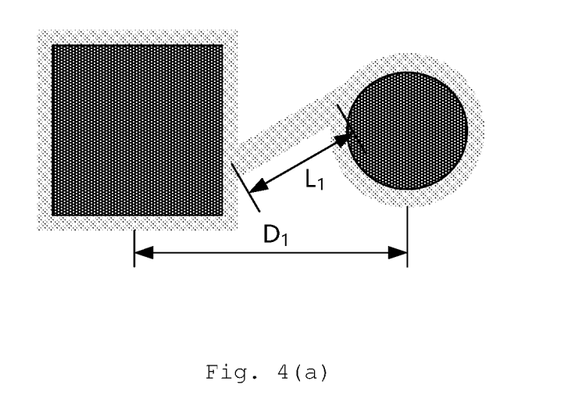
FIGS. 4(a)-4(d) are schematic diagrams of adjacent display units having progressively larger distances when being under tension in one embodiment of a display device according to the present disclosure.

Referring to FIGS. 2 and 4(a)-4 (d), when the display device is in an original state when it is not subjected to the tension (corresponding to FIG. 4(a)), an angle $\alpha$ between the normal 13 of the first type display unit 1 and the connection line 31 which is between the elastic connection points corresponding to the both ends of the stretching unit 3 and an angle $\beta$ between the connection line 31 and the normal 23 of the second type display unit 2 are both an acute angle. Currently, a length of the stretching unit 3 is $L_1$, and a center distance between the first type display unit 1 and the second type display unit 2 is $D_1$.

Figure 4B:
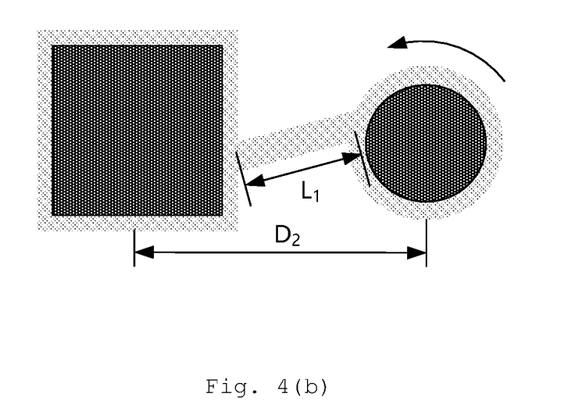

When the display device in FIG. 4(a) is subjected to the tension in the left-right direction, the elastic connection point of the stretching unit 3 with the first type display unit 1 and the elastic connection point with the second type display unit 2 are both elastically deformed. Referring to FIG. 4(b), the first type display unit 1 rotates relative to the second type display unit 2, and the angle $\alpha$ between the connection line 31 and the normal 13 of the first type display unit 1 and the angle $\beta$ between the connection line 31 and the normal 23 of the second type display unit 2 are both reduced. At this time, the stretching unit 3 will also be elastically deformed due to a component force of the tensile force in the direction of the connection line 31. However, since the component force is relatively small, the deformation amount of the stretching unit 3 itself is not significantly changed, and the length thereof is still approximately equal to $L_1$, but the center distance between the first type display unit 1 and the second type display unit 2 is $D_2$, which is increased compared with $D_1$, i.e., $D_2>D_1$.

Figure 4C:
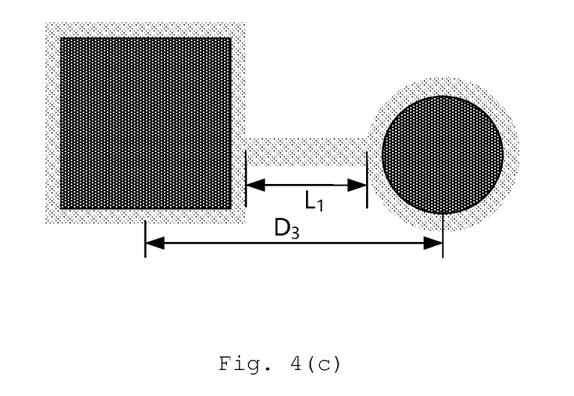

As the stretching proceeds, the angle $\alpha$ between the connection line 31 and the normal 13 of the first type of display unit 1 and the angle $\beta$ between the connection line 31 and the normal 23 of the second type of display unit 2 are both decreased to 0°. Referring to FIG. 4(c), the connection line 31 currently coincides with both the normal 13 and the normal 23. At this moment, the deformation of the stretching unit 3 itself is still relatively limited, so its length is still approximately equal to $L_1$, but the center distance between the first type display unit 1 and the second type display unit 2 is $D_3$, which is increased compared to $D_2$, i.e. $D_3>D_2$.

Figure 4D:
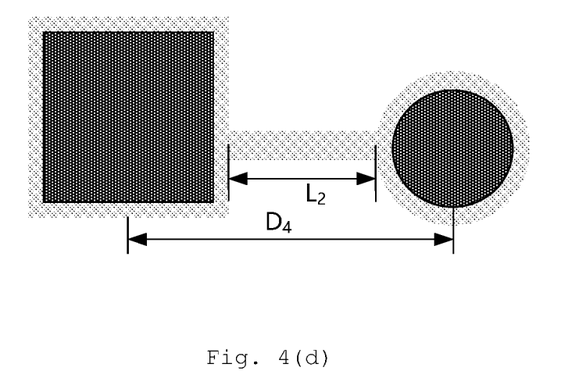

The display device can be further made longer under the tension. Referring to FIG. 4(d), the stretching unit 3 is elastically deformed under a tensile force, and its length is increased to $L_2$, where $L_2>L_1$. And as the length of the stretching unit 3 increases, the center distance between the first type display unit 1 and the second type display unit 2 is increased to $D_4$, which is further increased based on $D_3$, i.e., $D_4>D_3$.

When the tension applied to the display device is released, the display unit and the stretching unit in the display device are restored to the original state shown in FIG. 4(a).

Therefore, the display device can be stretched longer through a combination of the change of distance between the display units caused by the elastic deformation of the elastic connection point between the stretching unit and the display unit and the change of distance between the display units caused by the elastic elongation of the stretching unit itself, so that better stretching performance is obtained. In addition, the connection line between the elastic connection points corresponding to the both ends of the stretching unit is designed to be not parallel to the normal of the elastic connection points of the display unit, so that adjacent display units are closer to each other, the network distribution structure is more compact in shrinkage when not subjected to the tension, the pixel display area The pixel display area has a higher proportion of the overall area of the display device, and the aperture ratio of the display device is improved.

In the related embodiments as shown in FIGS. 4(a)-4(d), the elastic connection point is elastically deformed with a greater amount prior to the stretching unit itself, so that under the tensile force, the display device exhibits an effect of elastic swing of the stretching unit firstly with respect to the display unit. After the elastic swing reaches a limit angle, the elastic elongation of the stretching unit itself occurs. To achieve this sequence effect of the elastic deformation, the elastic connection points can be more easily deformed than the stretching unit in the lengthwise direction. In other embodiments, the elastic connection point can be less easily deformed than the stretching unit in the lengthwise direction.

In addition, in some embodiments, in the case where the stretching unit is integrally formed with the substrate of the display unit, the width of the stretching unit can be made smaller than the entire width of each of the two display units connected to the stretching unit, so as to prevent the display device from being broken due to deformation of the display unit being greater than the stretching unit when the display device is stretched.

When the display device is stretched, a limit angle value allowed by the included angle between the normal of the display unit at the elastic connection points and the connection line which is between the elastic connection points at the both ends of the stretching unit can be designed according to requirements; for example, the limit angle value is designed to be 0 degree, 3 degrees or 5 degrees. Referring to FIG. 3(a), respective thicknesses or bending rigidities can be set at p1 and p2 of the elastic connection points to satisfy the designed limit angle value.

Figure 5A:
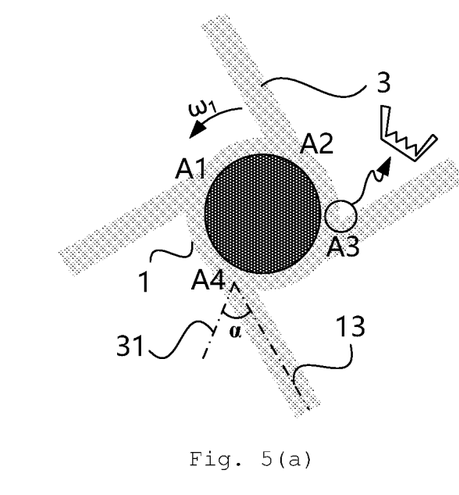
FIGS. 5(a)-5(b) are respectively schematic views of connection structures between a first type display unit and a plurality of stretching units according to some embodiments of the display device of the present disclosure.
Figure 5B:
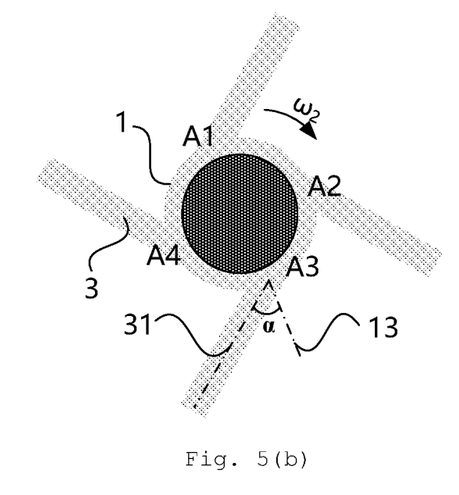

FIGS. 5(a)-5(b) are schematic views of connection structures between a first type display unit and a plurality of stretching units according to some embodiments of the display device of the present disclosure.

Referring to FIGS. 5(a)-5(b), in some embodiments, a plurality of stretching units 3 can be connected to an edge of the first type display unit 1. When the display device is not under tension, along the same rotation direction of the first type display unit 1, a connection line 31 (equivalent to the lengthwise direction of the straight strip-shaped stretching unit 3) between elastic connection points at both ends of each stretching unit 3 connected with the first type display unit 1 forms an acute angle $\alpha$ with respect to a normal 13 of the first type display unit 1 at the elastic connection points corresponding to the connecting line 31. In this way, when the first type display unit 1 and the stretching units 3 connected to the first type display unit 1 are subjected to a tensile force, the tensile force applied to each stretching unit 3 can form a torque in the same direction for rotating the first type display unit 1, so that when the display device is stretched, the first type display unit 1 can rotate faster to reduce the included angle between the connection line 31 and the normal 13 of the first type display unit 1.

The plurality of first type display units 1 can include a first display unit and a second display unit according to a difference in rotation direction. Taking FIGS. 5(*a*) and 5(*b*) as an example, the first display unit is configured such that, when the display device is not under tension, along the first rotation direction $\omega_1$ of the first display unit, a connection line between elastic connection points at both ends of each stretching unit connected to the first display unit forms an acute angle with respect to a normal of the first display unit at the elastic connection points. The second display unit is configured such that, when the display device is not under tension, along a second rotation direction $\omega_2$ of the second display unit, a connection line between elastic connection points at both ends of each stretching unit connected to the second display unit forms an acute angle with respect to a normal of the second display unit at the elastic connection points. The second rotation direction $\omega_2$ is opposite to the first rotation direction $\omega_1$.

In some embodiments, the elastic connection points A1, A2, A3 and A4 of the first type display unit 1 to each stretching unit 3 can be distributed at equal angles relative to the first type display unit 1, so that the moment borne by each elastic connection point of the first type display unit 1 when the display device is subjected to tension can be more balanced, and the service life of the display device can be prolonged.

In FIG. 5(*a*), at least part of the elastic connection points between the stretching unit and the display unit are provided with a corrugated structure. For example, in FIG. 5, the elastic connection point A3 is provided with a corrugated structure. The corrugated structure is not limited to the elastic connection points provided between the first type display unit 1 and the stretching unit 3 and can include a part of or the entire elastic connection points between the second type display unit or other display units and the stretching unit.

Figure 6:
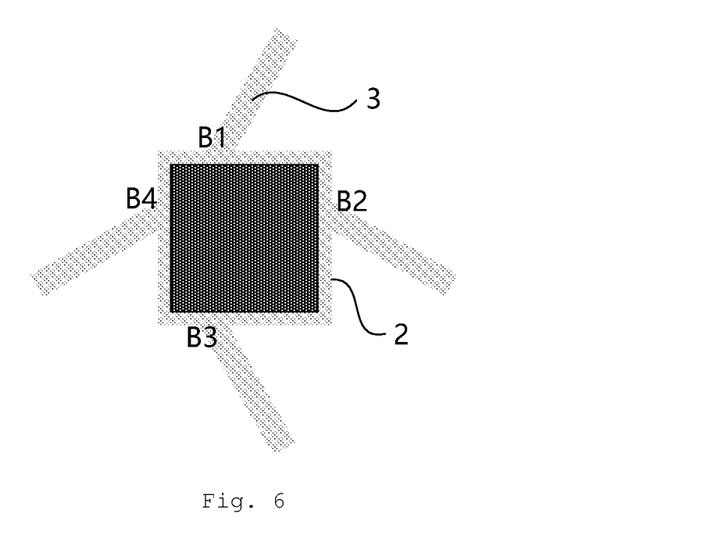
FIG. 6 is a schematic view of a connection structure between a second type display unit and a plurality of stretching units in one embodiment of a display device according to the present disclosure.

FIG. 6 is a schematic view of a connection structure between a second type display unit and a plurality of stretching units according to one embodiment of the display device of the present disclosure.

In some embodiments, each of the elastic connection points on the second type display unit includes at least one set of elastic connection points that are axisymmetric with respect to a center line of the second type display unit. Referring to FIG. 6, a plurality of stretching units 3 can be connected to an edge of the second type display unit 2, and the elastic connection points B1, B2, B3 and B4 of the second type display unit 2 to the respective stretching units 3 are axisymmetric with respect to the center line of the second type display unit 2. Specifically, in conjunction with FIG. 1, the elastic connection points B2 and B4 are axisymmetric with respect to the center line along the y-axis direction of the second type display unit 2. The elastic connection points B1 and B3 are axisymmetric with respect to the center line of the second display unit 2 along the x-axis direction. Thus, when the second type display unit 2 and the stretching unit 3 connected with the second type display unit 2 are subjected to tensile force in the x-axis or y-axis direction, the moments generated by the tensile force applied to the second type display unit 2 are mutually offset, so that the second type display unit 2 is not easy to rotate.

Thus, when the display device is stretched, a situation can occur in which one part of the display units rotate and another part of the display units do not rotate. In order to reduce image distortion caused by stretching of the display device during displaying, the area of the pixel region included in the first type display unit 1 can be smaller than the area of the pixel region included in the second type display unit 2. For example, the number of pixels in the second type display unit 2 is larger than the number of pixels in the first type display unit 1. In this way, even if the first type display unit 1 rotates when the display device is stretched, the influence on the image quality is relatively small. According to actual needs, the pixel display area of the first type display unit 1 can be set to be one pixel, so that the influence of the rotation of the first type display unit 1 on the display quality is further reduced.

In addition, referring to FIG. 2 and FIGS. 5(*a*)-6, when designing the display device, the first type display unit 1 and the second type display unit 2 can be designed in different regular shapes according to their characteristics. For example, the first type display unit 1 is made circular and the second type display unit 2 is made square to facilitate the arrangement of the elastic connection points. In other embodiments, the first type display unit 1 can also be polygonal or elliptical, and the second type display unit 2 can be rectangular, circular, polygonal, etc.

Figure 7:
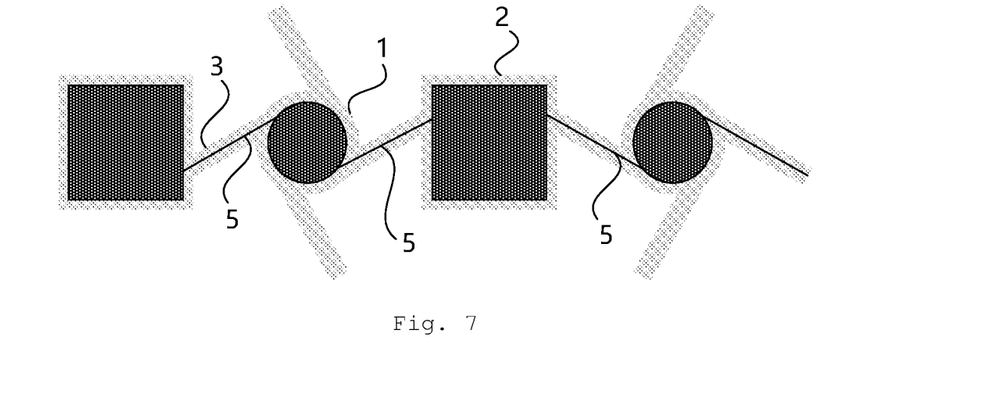
FIG. 7 is a schematic diagram of an arrangement of signal lines in a stretching unit in one embodiment of a display device according to the present disclosure.

FIG. 7 is a schematic diagram of an arrangement of signal lines in a stretching unit in one embodiment of a display device according to the present disclosure.

Referring to FIG. 7, in some embodiments, signal lines 5 can be included in the display device. The signal line 5 can be arranged along the stretching unit 3 for signal connection of adjacent display units connected with the stretching unit. For example, in FIG. 7, Thin Film Transistors (TFTs) of four display units in the lateral direction are signal connected to each other through three signal lines 5, and the signal lines 5 can be provided in the stretching unit 3 or attached to the surface of the stretching unit 3. The signal lines 5 can be formed from conductive materials, such as metal wires, nanotubes, nanowires, or conductive traces.

Figure 8:
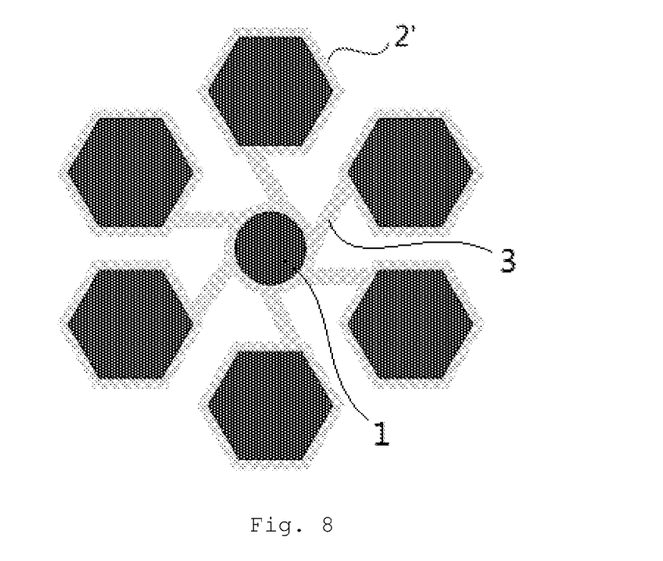
FIG. 8 is a schematic diagram of a connection structure between a first type display unit having a circular shape and a plurality of second type display units having a regular hexagonal shape according to one embodiment of a display device of the present disclosure.

FIG. 8 is a schematic view of a connection structure between a first type display unit having a circular shape and a plurality of second type display units having a regular hexagonal shape according to one embodiment of a display device of the present disclosure.

Referring to FIG. 8, in some embodiments, the shape of each display unit is not limited to a specific regular shape (e.g., square or circular). The second type display unit 2' in FIG. 8 is a regular hexagon. Six second type display units 2' are arranged around the first type display unit 1, and these six second type display units 2' all are connected with the first type display unit 1 through stretching units. The shape of the display unit and the number of connected stretching units enable a more compact network distribution. The display devices with different degrees of tightness can be realized according to the designs with different shapes of the display units and the number of the connected stretching units so as to meet different display and stretching requirements.

Figure 9:
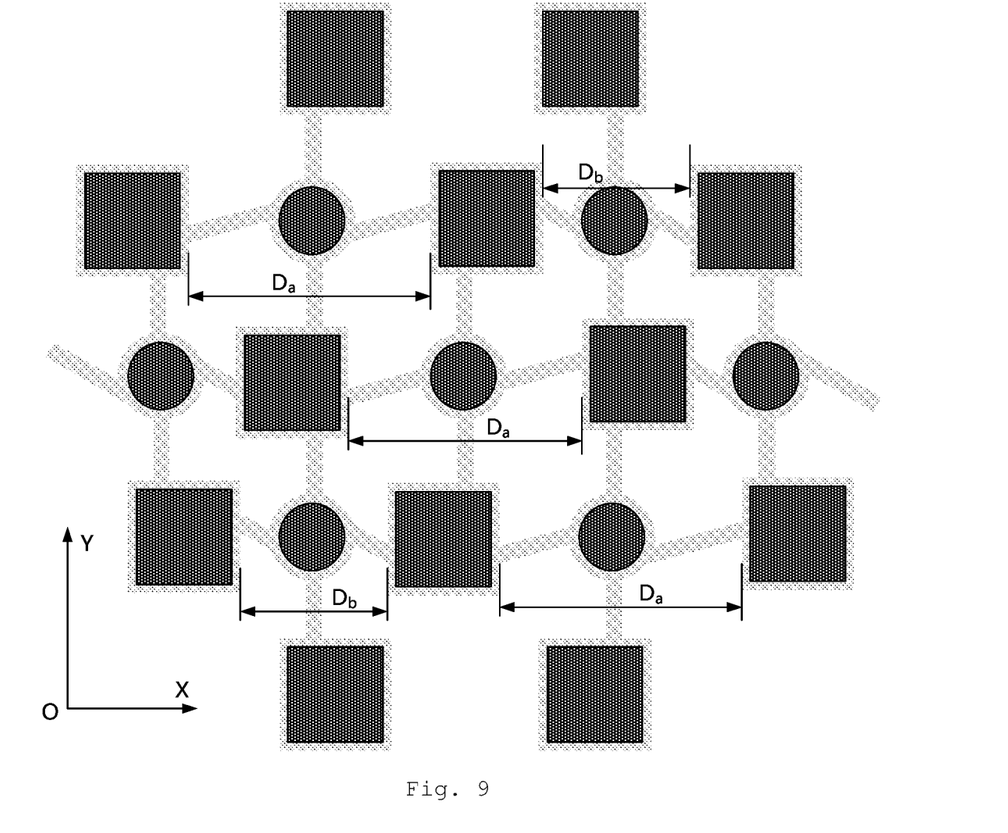
FIG. 9 is a schematic diagram of a structure of one embodiment of a display device according to the present disclosure when subjected to a tension in a single direction (Y direction)

FIG. 9 is a schematic view of a structure of one embodiment of a display device according to the present disclosure when subjected to a tension in a single direction (Y direction).

Referring to FIGS. 1, 5(*a*)-5(*b*) and 9, in some embodiments, the first display units and the second display units are alternately arranged along at least one preset direction in the net-shaped distribution structure. For example, in FIG. 1, two first type display units in the second row are a first display unit and a second display unit, respectively. The first type display units on both sides of three first type display units in the third row are both first display units, and the first type display unit in the middle is a second display unit. In some embodiments, the at least one preset direction can include a first direction and a second direction (e.g., an X-axis direction and a Y-axis direction in FIG. 1) that are orthogonal to each other. Referring to FIG. 1, the first display units and the second display units in each row and each column along the X-axis direction and the Y-axis direction can be alternately arranged.

This configuration enables the stress on the display device to be more balanced. Referring to FIG. 9, when the display device is subjected to a tensile force in the Y-axis direction, the spacing between adjacent display units along the Y-axis direction is widened, and the stretching unit between these adjacent display units tends to swing to the same direction as the Y-axis or adjacent direction to the Y-axis. At this time, an angle between a normal of the second display unit at the elastic connection points and a connection line between the elastic connection points at both ends of the stretching unit connected with second display unit along the X-axis direction (corresponding to the lengthwise direction of the stretching unit having a straight strip shape) becomes smaller than an angle when the display device is not under tension, so that a distance $D_a$ between two second type display units adjacent to the second display unit in the X-axis direction becomes larger, while a distance Db between two second type display units adjacent to the first display units which are alternately arranged in the same row as the second display unit along the X-axis direction is reduced. This makes the width of the display device along the X-axis direction less likely to change greatly when the display device is stretched in the Y-axis direction, thereby reducing the adverse effect on the display quality when the display device is stretched. In addition, the structure can also enable the moments borne by the second type display unit to be mutually offset as much as possible, so that the situation that the second type display unit rotates when the display device is stretched is reduced or prevented, and a better display effect is achieved.

Figure 10:
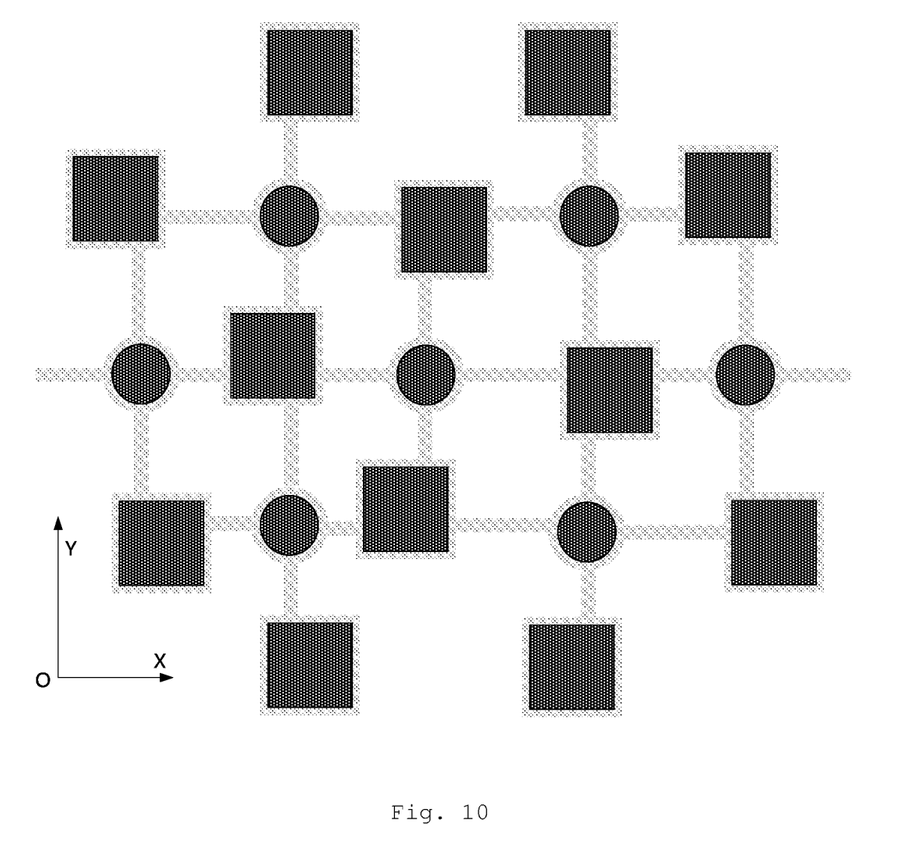
FIG. 10 is a schematic diagram of a structure of one embodiment of a display device according to the present disclosure when subjected to tensions in orthogonal X-direction and Y-direction simultaneously.

FIG. 10 is a schematic diagram of a structure of one embodiment of a display device according to the present disclosure when subjected to tensions in orthogonal X-direction and Y-direction simultaneously.

Referring to FIG. 10, when the display device is simultaneously subjected to tensile forces in two directions (e.g., X-axis and Y-axis) orthogonal to each other, the angle between the connection line connecting the elastic connection points at the both ends of each stretching unit and the normal of the display unit connected thereto is reduced until the allowable limit angle value is reached. Then, each stretching unit is elastically stretched under a tensile force, so that the entire area of the display device is enlarged. When the tensile force applied to the display device is stopped, the display device is restored to its original shape and size.

Having described in detail various embodiments of the display device of the present disclosure, the present disclosure also provides some embodiments of a method for manufacturing the display device as described above.

Figure 11:
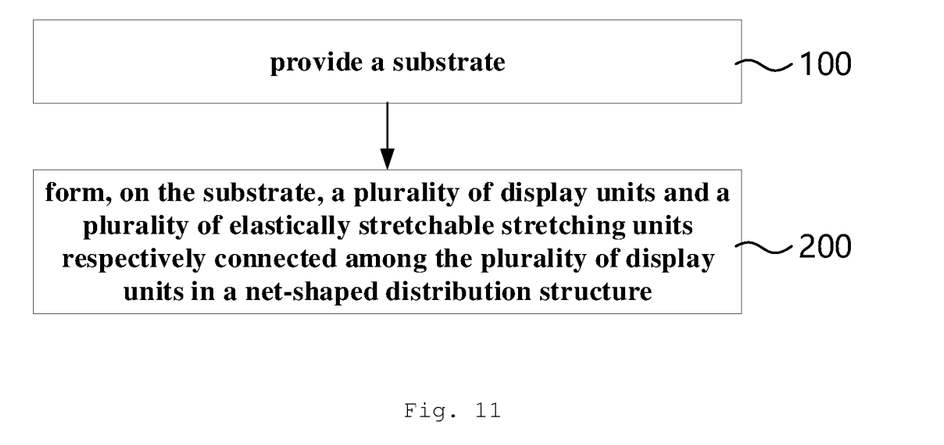
FIG. 11 is a schematic flow chart of one embodiment of a method for manufacturing a display device according to the present disclosure.

FIG. 11 is a schematic flow diagram of one embodiment of a method for manufacturing a display device according to the present disclosure.

Referring to FIG. 11, in some embodiments, a method for manufacturing a display device includes steps 100 and 200. In step 100, a substrate is provided. In step 200, a plurality of display units and a plurality of elastically stretchable stretching units 3 respectively connected among the plurality of display units are formed on the substrate in a net-shaped distribution structure (refer to FIG. 1).

The stretching unit 3 forms an elastic connection point with the display unit. In a state that the display device is not under tension, referring to FIG. 2, a connection line 31 between the elastic connection points corresponding to the both ends of the stretching unit 3 is not parallel to a normal of the display unit connected with at least one end of the stretching unit at the elastic connection points.

Figure 12:
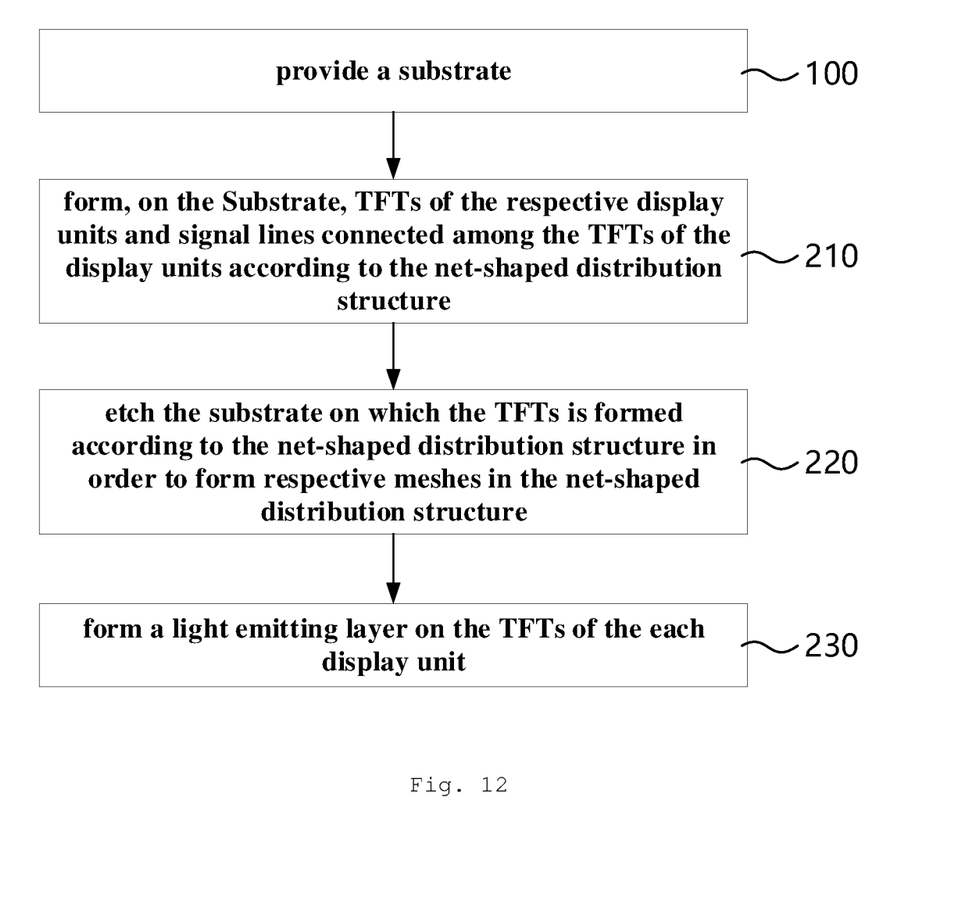
FIG. 12 is a schematic flow chart of another embodiment of a method for manufacturing a display device according to the present disclosure.

FIG. 12 is a schematic flow diagram of another embodiment of a method for manufacturing a display device according to the present disclosure.

Compared with the embodiment shown in FIG. 11, the step 200 in the present embodiment can specifically include the steps 210 to 230. In step 210, TFTs of the respective display units and signal lines connected among the TFTs of the respective display units are formed on the substrate according to the net-shaped distribution structure. In step 220, the substrate on which the TFTs is formed is etched according to the net-shaped distribution structure to form respective meshes in the net-shaped distribution structure. In step 230, a light emitting layer, such as an inorganic LED, OLED, or QLED, is formed on the TFT of each display unit.

The order of steps 210 and 220 can be exchanged. That is, in some embodiments, the mesh can be etched according to the net-shaped distribution structure, and then the TFTs of the display units and the signal lines connected among the TFTs of the display units can be formed on the substrate layer distributed in meshes.

In the present specification, a plurality of embodiments are described in a progressive manner, the emphasis of each embodiment is different, and the same or similar parts between the embodiments are referred to each other. For the embodiments of the manufacturing method, the whole and related steps are in corresponding relation with the content in the embodiments of the display device, so that the description is relatively simple, and relevant points can be referred to in the part of the description of the embodiments of the display device.

Thus, various embodiments of the present disclosure have been described in detail. Some details that are well known in the art have not been described in order to avoid obscuring the concepts of the present disclosure. It will be fully apparent to those skilled in the art from the foregoing description how to practice the presently disclosed embodiments.

Although some specific embodiments of the present disclosure have been described in detail by way of example, it should be understood by those skilled in the art that the foregoing examples are for purposes of illustration only and are not intended to limit the scope of the present disclosure. It will be understood by those skilled in the art that various amendments can be made in the above embodiments or equivalents can be substituted for partial technical features thereof without departing from the scope and spirit of the present disclosure. The scope of the present disclosure is defined by the appended claims.

The invention claimed is:
1. A display device, comprising:
    a plurality of display units, each display unit comprising one or more pixels; and
    a plurality of elastically stretchable stretching units respectively connected among the plurality of display units and forming elastic connection points with the plurality of display units, the plurality of elastically stretchable stretching units and the plurality of display units forming a net-shaped distribution structure,
    wherein, in a state that the display device is not under tension, a connection line between the elastic connection points at both ends of the elastically stretchable stretching unit is not parallel to a normal of the display unit connected with at least one end of the elastically stretchable stretching unit at the elastic connection points; and
    wherein, the plurality of display units comprise:
    a plurality of first type display units; and
    a plurality of second type display units, respectively connected with the plurality of first type display units through the plurality of elastically stretchable stretching units, each elastic connection point on a second type display unit comprising at least one group of elastic connection points which are axisymmetric relative to a center line of the second type display unit,
    wherein, when the display device is not under tension, along a same rotation direction of a first type display unit, the connection line between elastic connection points at both ends of each elastically stretchable stretching unit connected with the first type display unit forms an acute angle with a normal of the first type display unit at the elastic connection points corresponding to the connection line;
    the plurality of first type display units comprise:
    a first display unit configured such that when the display device is not under tension, along a first rotation direction of the first display unit, the connection line between the elastic connection points at both ends of each elastically stretchable stretching unit connected with the first display unit forms an acute angle with a normal of the first display unit at the elastic connections points; and
    a second display unit configured such that when the display device is not under tension, along a second rotation direction of the second display unit, the connection line between the elastic connection points at both ends of each elastically stretchable stretching unit connected with the second display unit forms an acute angle with a normal of the second display unit at the elastic connection points, wherein the second rotation direction is opposite to the first rotation direction, and the first display unit and the second display unit are located on opposite sides of the second type display unit.
2. The display device according to claim 1, wherein the plurality of first type display units and the plurality of second type display units are alternately provided.
3. The display device according to claim 1, wherein the first type display unit comprises a pixel region having an area smaller than that of a pixel region comprised in the second type display unit.
4. The display device according to claim 1, wherein the first type display unit has a circular shape, and the second type display unit has a square or regular hexagonal shape.
5. The display device according to claim 1, wherein the first display units and the second display units are provided alternately in at least one preset direction in the net-shaped distribution structure.
6. The display device according to claim 5, wherein the at least one preset direction comprises a first direction and a second direction that are orthogonal to each other.
7. The display device according to claim 1, wherein the elastically stretchable stretching unit has a straight strip shape.
8. The display device according to claim 1, wherein the elastically stretchable stretching unit is formed integrally with substrate of the plurality of display units.
9. The display device according to claim 1, wherein the net-shaped distribution structure comprises a plurality of polygonal meshes, and a number of sides of at least part of the plurality of polygonal meshes is greater than or equal to four.
10. The display device according to claim 1, wherein the net-shaped distribution structure comprises a plurality of meshes, and at least part of the plurality of meshes comprise a hollow structure.
11. The display device according to claim 1, wherein at least part of the elastic connection points formed by the plurality of elastically stretchable stretching units and the plurality of display units are provided with a corrugated structure.
12. The display device according to claim 1, further comprising:
    a signal line, arranged in the elastically stretchable stretching unit, for a signal connection of adjacent display units connected with the elastically stretchable stretching unit.
13. The display device according to claim 1, wherein the display unit comprises an organic light emitting diode or a quantum dot light emitting diode.
14. A method for manufacturing a display device, comprising:
    providing a substrate;
    forming, on the substrate, a plurality of display units and a plurality of elastically stretchable stretching units respectively connected among the plurality of display units in a net-shaped distribution structure,
    wherein the plurality of elastically stretchable stretching units form elastic connection points with the plurality of display units, and in a state that the display device is not under tension, a connection line between the elastic connection points corresponding to both ends of the elastically stretchable stretching unit is not parallel to a normal of the display unit connected with at least one end of the elastically stretchable stretching unit at the elastic connection points; and
    wherein, the plurality of display units comprise:
    a plurality of first type display units; and
    a plurality of second type display units, respectively connected with the plurality of first type display units through the plurality of elastically stretchable stretching units, each elastic connection point on a second type display unit comprising at least one group of elastic connection points which are axisymmetric relative to a center line of the second type display unit,
    wherein, when the display device is not under tension, along a same rotation direction of a first type display unit, the connection line between elastic connection points at both ends of each elastically stretchable stretching unit connected with the first type display unit forms an acute angle with a normal of the first type display unit at the elastic connection points corresponding to the connection line;

the plurality of first type display units comprise:

a first display unit configured such that when the display device is not under tension, along a first rotation direction of the first display unit, the connection line between the elastic connection points at both ends of each elastically stretchable stretching unit connected with the first display unit forms an acute angle with a normal of the first display unit at the elastic connection points; and a second display unit configured such that when the display device is not under tension, along a second rotation direction of the second display unit, the connection line between the elastic connection points at both ends of each elastically stretchable stretching unit connected with the second display unit forms an acute angle with a normal of the second display unit at the elastic connection points, wherein the second rotation direction is opposite to the first rotation direction, wherein the first display unit and the second display unit are located on opposite sides of the second type display unit.

15. The manufacturing method according to claim 14, wherein the operation of forming the display units and the elastically stretchable stretching unit comprises:

forming, on the substrate, thin film transistors of the respective display units and signal lines connected among the thin film transistors of the plurality of display units according to the net-shaped distribution structure;

etching the substrate on which the thin film transistors is formed according to the net-shaped distribution structure in order to form respective meshes in the net-shaped distribution structure; and forming a light emitting layer on the thin film transistor of each display unit.

16. The manufacturing method according to claim 14, wherein each elastic connection point on a second type display unit comprises at least one group of elastic connection points which are axisymmetric relative to a center line of the second type display unit.

17. The manufacturing method according to claim 14, wherein the plurality of first type display units and the plurality of second type display units are alternately provided.

18. The manufacturing method according to claim 14, wherein the first type display unit comprises a pixel region having an area smaller than that of a pixel region comprised in the second type display unit.

* * * * *